(12) United States Patent
Miranda et al.

(10) Patent No.: US 7,415,780 B2
(45) Date of Patent: Aug. 26, 2008

(54) METHOD AND APPARATUS FOR REMOVING LIQUID FROM SUBSTRATE SURFACES USING SUCTION

(75) Inventors: Henry R. Miranda, Fremont, CA (US); Mark Dye, San Jose, CA (US)

(73) Assignee: P.C.T. Systems, Inc., Fremont, CA (US)

( * ) Notice: Subject to any disclaimer, the term of this patent is extended or adjusted under 35 U.S.C. 154(b) by 0 days.

(21) Appl. No.: 11/224,793

(22) Filed: Sep. 12, 2005

(65) Prior Publication Data

US 2006/0005421 A1 Jan. 12, 2006

Related U.S. Application Data

(63) Continuation of application No. 10/461,789, filed on Jun. 13, 2003, now Pat. No. 6,959,503.

(51) Int. Cl.
*F26B 5/12* (2006.01)

(52) U.S. Cl. ............................. 34/397; 34/92; 15/300.1

(58) Field of Classification Search .................. 34/361, 34/397, 399, 406, 453, 92, 635, 643, 653, 34/403, 559, 581, 69, 70, 71, 605; 150/302, 150/306.1, 309.1, 309.2
See application file for complete search history.

(56) References Cited

U.S. PATENT DOCUMENTS

| | | | | |
|---|---|---|---|---|
| 2,753,707 | A | * | 7/1956 | Laverdisse ..................... 68/20 |
| 3,056,213 | A | | 10/1962 | Kellogg |
| 3,503,136 | A | | 3/1970 | Fleissner |
| 3,968,571 | A | | 7/1976 | Oschatz et al. |
| 4,755,769 | A | * | 7/1988 | Katz ........................... 330/295 |
| 5,301,701 | A | | 4/1994 | Nafziger |
| 5,581,906 | A | | 12/1996 | Ensign et al. |
| 5,737,796 | A | * | 4/1998 | Sendzimir et al. ............... 15/308 |
| 5,862,820 | A | * | 1/1999 | Kageyama et al. ............. 134/64 R |
| 5,873,014 | A | | 2/1999 | Knapp et al. |
| 5,953,823 | A | | 9/1999 | Huang |
| 5,966,836 | A | | 10/1999 | Valdez, III et al. |
| 6,286,524 | B1 | | 9/2001 | Okuchi et al. |
| 6,434,856 | B1 | | 8/2002 | Ensign et al. |
| 6,435,200 | B1 | * | 8/2002 | Langen ........................ 134/99.1 |
| 6,446,358 | B1 | * | 9/2002 | Mitsumori et al. ............... 34/611 |

* cited by examiner

*Primary Examiner*—Kenneth B Rinehart
(74) *Attorney, Agent, or Firm*—Townsend and Townsend and Crew LLP

(57) ABSTRACT

A cost effective and environmentally sound method for quickly removing liquid from surfaces of a substrate under manufacture without leaving behind substantial residue (e.g., silicon elements from the substrate, commonly known in the field as "water marks"). The process includes first providing a substrate (e.g., a semiconductor wafer, glass flat panel, or disc media), which has undergone one or more liquid-based processes (e.g., cleaning, scrubbing, rinsing, etc.). An upper surface and a lower surface of the substrate are then subjected to vacuum suction, thereby removing liquid thereon. An apparatus for removing liquid from surfaces of a substrate is also provided. The apparatus includes a plurality of vacuum application members configured for applying vacuum suction to surfaces of a substrate, thereby removing liquid therefrom. The vacuum application member includes, for example, vacuum slots configured for disposition in proximity to the substrate surfaces and/or at least partially porous tubes configured for moving contact with the substrate surfaces. The apparatus can process one substrate at a time or remove liquid from multiple substrates simultaneously.

17 Claims, 5 Drawing Sheets

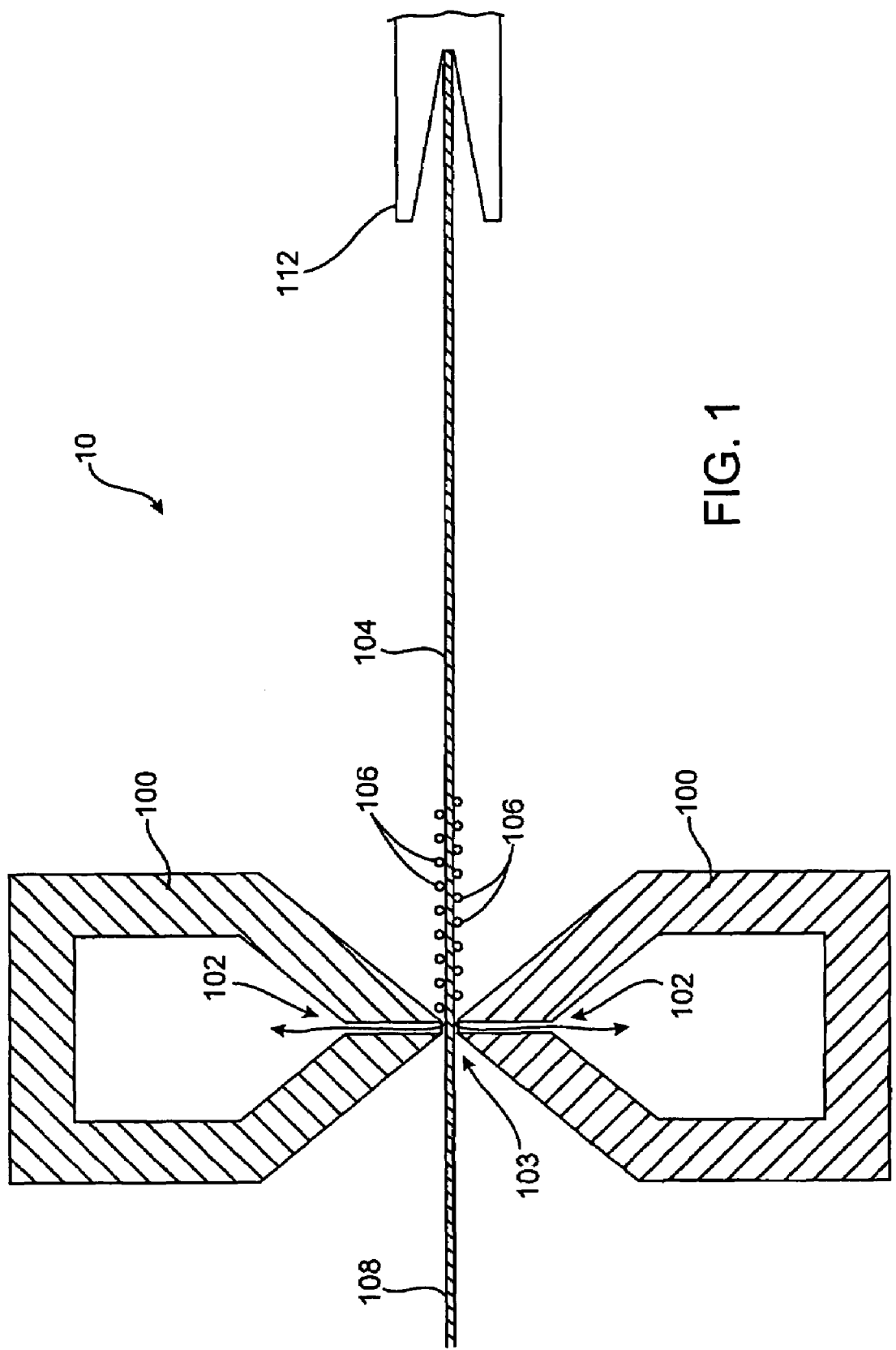

METHOD AND APPARATUS FOR REMOVING LIQUID FROM SUBSTRATE SURFACES USING SUCTION

CROSS-REFERENCES TO RELATED APPLICATIONS

This application claims priority to U.S. application Ser. No. 10/461,789, filed Jun. 13, 2003, which is incorporated by reference herein.

BACKGROUND OF THE INVENTION

1. Field of the Invention

The present invention relates generally to substrate drying technology and, more particularly, to a method and apparatus for removing liquid from semiconductor wafer surfaces under manufacture.

2. Description of the Related Art

The manufacturing of semiconductor devices (e.g., integrated circuits or flat panel displays) typically involves subjecting a substrate (e.g., a semiconductor wafer or glass flat panel) to a series of thin layer formation, patterning, ion implantation and liquid-based processes. Consequently, it is often necessary to remove liquids from surfaces of the substrate following the liquid-based processes (e.g., liquid-based cleaning, scrubbing, and rinsing processes). Such liquid removal processes are referred to as "drying" processes and the associated apparatus typically referred to as "dryers."

Conventional drying methods and apparatus include (a) spin-rinser methods and apparatus wherein a substrate is rinsed with a liquid (e.g., water) and then spun at a high speed to remove liquid from its surfaces; (b) isopropyl alcohol (IPA) vapor methods and apparatus wherein IPA vapor is employed to displace the liquid and then is itself evaporated from the surfaces and (c) Marangoni methods and apparatus wherein a solvent meniscus is used to displace liquid from substrate surfaces.

Conventional methods and apparatus for removing liquid can leave residue, which was dissolved in the liquid, behind on the surfaces of the substrate. The presence of such residue on the substrate surface is commonly referred to in the field as a "water mark." These water marks are believed to include various silicon-based solid materials such as silicon dioxide (SiO2). Water marks are created due to the presence of silicon elements from the substrate which have been dissolved in liquid drops and appear after removal of the liquid drops from the surface of the substrate.

Conventional drying methods and apparatus can be expensive to purchase, operate and maintain. Furthermore, the use of solvents (e.g., IPA) in many conventional drying methods and apparatus presents an environmental problem in terms of emission control and disposal.

Still needed in the field, therefore, are a method and apparatus for quickly removing liquid from surfaces of a substrate (e.g., a semiconductor wafer) without leaving behind substantial residue (e.g., water marks). In addition, the method and apparatus should be cost effective and environmentally sound.

BRIEF SUMMARY OF THE INVENTION

The present invention provides a method and apparatus for removing liquid from surfaces of a substrate under manufacture without leaving behind substantial residue (e.g., water marks or other solid materials). The method and apparatus according to the present invention provide quick removal of liquid, and are cost effective and environmentally sound.

Processes in accordance with the present invention include first providing a substrate (e.g., a semiconductor wafer, glass flat panel or disc media), which has undergone one or more liquid-based processes (e.g., cleaning, scrubbing, rinsing, etc.). An upper surface and a lower surface of the substrate are then subjected to vacuum suction, thereby removing liquid thereon. In one exemplary embodiment, the vacuum suction is applied to the surfaces using slots disposed in proximity to the surfaces. In another exemplary embodiment, application of the vacuum suction is through at least partially porous tubes in moving contact with the surfaces. Since liquid is removed by vacuum suction, rather than evaporation, no solid residue remains on the substrate surfaces, thereby no "water marks" are produced. Since no solvents (e.g., alcohol) are used, processes according to the present invention are environmentally sound. In addition, since the processes do not require the introduction of nitrogen or complicated equipment, they are cost effective.

Also provided is an apparatus for removing liquid from surfaces of a substrate (e.g., a semiconductor wafer, glass flat panel or disc media). The apparatus includes a plurality of vacuum application members configured for applying vacuum suction to surfaces of a substrate, and thereby removing liquid therefrom. In one embodiment, the vacuum application member includes vacuum slots configured for disposition in proximity to the substrate surfaces. In another exemplary embodiment, the vacuum application member includes at least partially porous tubes configured for moving contact with the substrate surfaces. Such an apparatus is simple, compact and inexpensive to manufacture. In addition, apparatus according to the present invention can be modified to remove liquid from multiple substrates simultaneously.

A better understanding of the features and advantages of the present invention will be obtained by reference to the following detailed description that sets forth illustrative embodiments, in which the principles of the invention are utilized, and the accompanying drawings.

BRIEF DESCRIPTION OF THE DRAWINGS

FIG. 1 is a schematic diagram of an apparatus for removing liquid from substrate surfaces according to one exemplary embodiment of the present invention;

DETAILED DESCRIPTION OF THE INVENTION

Figure 1A:
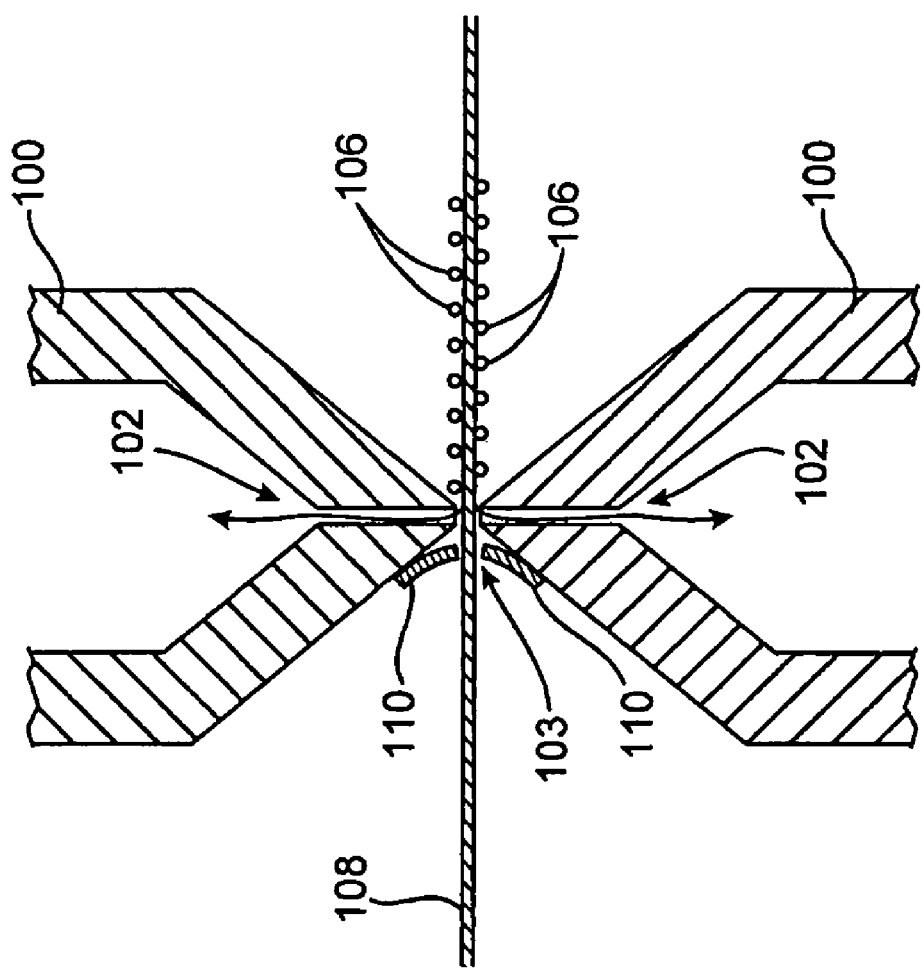
FIG. 1A is an enlarged schematic diagram of a portion of the apparatus of FIG. 1 showing a modification of the exemplary embodiment of the present invention.

For ease of illustration and exemplary purposes only, inventive processes will be described using apparatus drawn in FIGS. 1-3 that are configured to remove liquid from one substrate at a time. However, once apprised of the present invention, one skilled in the art can readily modify the processes and apparatus to remove liquid from surfaces of multiple substrates simultaneously.

Processes in accordance with the present invention include first providing a substrate, which has undergone one or more liquid-based processes (e.g., cleaning, scrubbing, rinsing, etc.). Such substrates include, but are not limited to, semiconductor wafers (e.g., silicon and gallium arsenide wafers), disc media (e.g., DVD and CD disc media) and glass flat panels. Since the substrate has undergone a liquid-based process, residual liquid (e.g., water) will be present on the surfaces of the substrate. An upper surface and a lower surface of the substrate are then subjected to vacuum suction, thereby removing liquid thereon.

In processes according to the present invention, the vacuum suction is applied such that liquid is removed from surfaces of the substrate while the liquid remains essentially in the liquid state. In other words, the suction is not employed to evaporate the liquid from the substrate surfaces but rather to forcibly remove (pull) the liquid from the substrate surface. Since the liquid is removed without evaporation, solid material dissolved in the liquid is also removed by suction, thereby preventing formation of water marks or other residue.

Although any suitable technique can be employed to apply the vacuum suction to the substrate surfaces, one such technique involves the use of multiple vacuum application members 100, each with a slot 102 disposed in proximity to surfaces of the substrate 104, as illustrated in FIG. 1. In this technique, vacuum suction, preferably of equal strength (indicated by the vertical arrows in FIG. 1), is applied to the upper and lower surfaces and the strength of vacuum suction is, thereby, balanced on these surfaces and the substrate remains free of contact with slots 102 and vacuum application members 100.

As shown in FIG. 1, the multiple vacuum application members 100 are separated by a gap 103 so that a substrate can freely travel between the vacuum application members without contact. Although any suitable gap size can be employed (and the velocity of vacuum suction can be varied accordingly), a typical gap size would provide a 1/32 of an inch clearance between the substrate and slot 102.

Since liquid is removed from the substrate while the substrate is free of contact with the vacuum application members, there is no risk of damaging the substrate's surfaces. Therefore, the process is particularly suitable for removing liquid from substrates with damage-prone surfaces and textured surfaces including, but not limited to, glass substrates for flat panel displays, disc media and substrates with surface features (e.g., steps and grooves).

Figure 2:
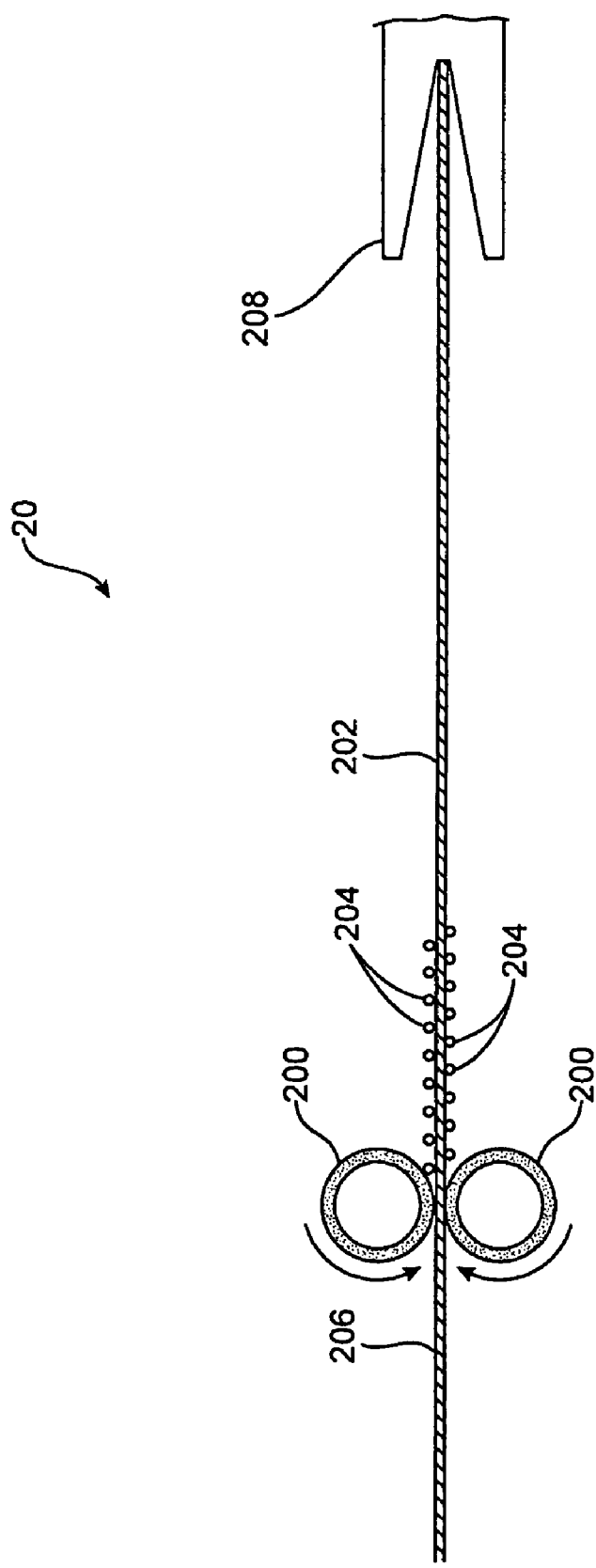
FIG. 2 is a schematic diagram of an apparatus for removing liquid from substrate surfaces according to another exemplary embodiment of the present invention.

As shown in FIG. 1A, the vacuum application members 100 may be fitted with skirts 110 if desired. The skirts 110 preferably extend at least partially around the outside of the vacuum application members 110 and into contact with the surfaces of substrate 104 on the "dry" side 108 of the substrate 104. The skirts 110 may be integrally formed with the members 100 or may be separate structures that are selectively removable. Preferably the skirts are formed of a material compatible with the material of the members 100, and preferably having a wicking capability to wick off any excess fluid that may not have been completely removed by the vacuum application members 100 as the substrate moves by them. A suitable material is polyvinyl acetate (PVA).

During the application of vacuum suction, the substrate is moved at a predetermined rate between the slots 102 so that the slots 102 pass over the entire substrate. A preferred rate of movement is between about 1 millimeter per second and about 100 millimeters per second. In this manner, liquid (drawn as liquid droplets 106 in the figure) from the entirety of the surfaces are removed via suction as the droplets pass across (i.e., under or over) slots 102, as illustrated in FIG. 1. The vertical arrows of FIG. 1 indicate the direction of vacuum suction and liquid removal. As a "wet" substrate (i.e., a substrate 104 with liquid droplets 106) moves between the slots from one side (e.g., the right hand side of FIG. 1), a "dry" substrate 108 emerges on the other side (e.g., the left-hand side of FIG. 1).

In the case where skirts 110 are provided, the skirts selectively extend the area of the vacuum suction relative to the surfaces of substrate 104. Thus liquid, such as droplets 16, may begin to be loosened or even removed from the surfaces as they approach the slots 102. Additionally, liquid remaining on the surfaces after passing slots 102 may be wicked from the surface and suctioned away.

The amount of suction force required will depend on the application, including the size of the substrate and the slots 102, as well as whether skirts are employed. Generally, however, vacuum pressures in the range of approximately 50 inches Hg, and air volumes ranging from approximately 1 cfm to approximately 100 cfm are suitable.

Movement of the substrates across the slots can be accomplished by using any suitable mechanical apparatus including, but not limited to, end-effector apparatus (such as element 110 of FIG. 1), conveyer belt apparatus, roller-based apparatus and robotic apparatus. For example, following a liquid-based process (e.g., cleaning, scrubbing, rinsing, etc.), a substrate can be picked up at its edge by an end-effector (or other robotic apparatus) and transported between two vacuum application members at a predetermined speed. The substrate is moved across the slots by the end-effector (or robotic apparatus), allowing vacuum suction from the slots to remove liquid from its surfaces, and then either placed into a cassette or picked up by another end-effector (or other robotic apparatus) on the other side of the vacuum application members. Similarly, when a conveyer belt or roller-based apparatus is used, a substrate travels on a conveyer belt(s) or roller(s), passes between the vacuum application members, and is picked up by another conveyer belt(s) or roller(s) on the other side.

In a process according to another exemplary embodiment of the present invention, application of the vacuum suction to a substrate is through at least partially porous tubes in moving contact with upper and lower surfaces of the substrates. Such moving contact can be achieved by either (i) rolling the tubes across these surfaces or (ii) moving the substrate itself in relation to the tubes. In the former case, the tubes may be rotatably driven by a motor or the like, or may be freely rotatable relative to the substrate.

In the former technique for providing moving contact, vacuum suction is applied through tubes with porosity along their entire circumference and the tubes are rotated at a predetermined speed across an upper surface and a lower surface of a substrate. Referring to FIG. 2, as the tubes 200 are rotated, a substrate 202 is drawn and/or pushed between the tubes 200 and liquid (illustrated as liquid droplets 204 in the figure) is removed from its surfaces via vacuum suction through pores of the tubes. Preferably, the substrate 202 moves relative to the tubes 200 at a rate of about 1 millimeter per second to about 100 millimeters per second. In FIG. 2, arrows indicate the direction of the tubes' rotation. As porous tubes roll across a "wet" substrate (i.e., a substrate with liquid droplets 204) from one end of the substrate to the other, a "dry" substrate 206 emerges. As described above, any suitable mechanical apparatus including, but not limited to, end-effector apparatus (shown as element 208 in FIG. 2), conveyer belt apparatus, roller-based apparatus and robotic apparatus can transport a substrate to and from the tubes, and optionally, thereafter, into a cassette.

Figure 3:
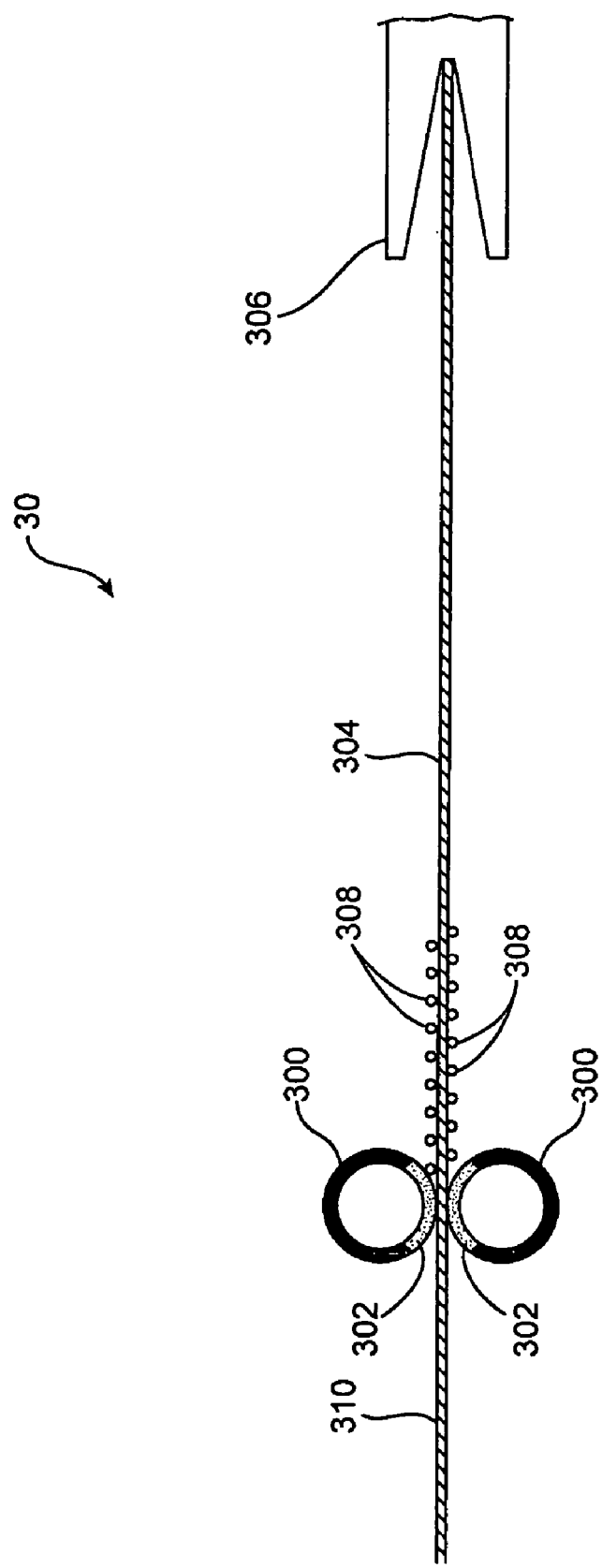
FIG. 3 is a schematic diagram of an apparatus for removing liquid from substrate surfaces according to yet another exemplary embodiment of the present invention.

In the latter technique for providing moving contact, vacuum suction is applied through stationary tubes 300 with porosity along only a portion 302 of their circumference that is adjacent to a substrate 304, as illustrated in FIG. 3. The substrate 304 is moved at a predetermined speed through the stationary tubes 300 by a suitable mechanical apparatus, such as end effector 306. Preferably, the rate of movement of the substrate relative to the tubes 300 is between about 1 millimeter per second and about 100 millimeters per second. The mechanical apparatus 306 includes, but is not limited to, end effector apparatus, conveyer belt apparatus, roller-based apparatus and robotic apparatus. As the stationary tubes 300 pass over the entire substrate, they remove liquid (drawn as liquid droplets 308 in the figure) from its surfaces via vacuum suction applied through the porous portion 302. As a "wet" substrate 304 (i.e., a substrate with liquid droplets 308) moves across the stationary tubes (from right to left in FIG. 3), a "dry" substrate 310 emerges. The substrate can then be placed into a cassette by mechanical apparatus 306 or picked up by another suitable mechanical apparatus. Unlike the former embodiment where the tubes are porous around their entire circumference, only a portion (e.g., 20% to 33% or any suitable amount) of these stationary tubes is porous and the remainder is either formed without porosity or has its porosity closed off with a suitable coating. The vacuum suction is, therefore, beneficially concentrated at the substrate surfaces.

These porous tubes (i.e., whether tubes rolls across a substrate or the substrate moves relative to the tubes) can be made of any suitable material known to those skilled in the art that are durable, but do not scratch the substrate surfaces. Such material includes, but is not limited to polyvinyl acetate, polyethylene, polypropylene, perfluoroacetate, Teflon, polyvinylidene fluoride, polytetrafluoroethylene, or even sintered stainless steel if the substrate is relatively resistant to physical contact damage. Although any suitable pore size of the tubes can be employed, and the velocity of vacuum suction can be adjusted accordingly, typical pore size is in the range of 20 to 35 micron. Since the porous tubes are in direct contact with the substrate surfaces, liquid from patterned semiconductor wafers can be efficiently removed. Furthermore, since the tubes are in contact with the substrate, liquid can be easily removed from not only the upper and lower surfaces but also edge surfaces of the substrate.

Similarly to the technique discussed with respect to the exemplary embodiment of FIG. 1, the vacuum suction pressure and airflow employed will depend on a number of factors including the size of the substrate and rollers, and the porosity of the rollers. Depending on these factors and the nature of the substrate, a wide range of vacuum suction pressures and air flows are suitable for use, limited essentially by the ability to adequately remove liquid from the surfaces of the substrate without damaging the surfaces. However, a higher value of vacuum suction pressures will generally be required with the porous rollers shown in the embodiments of FIGS. 2 and 3, than with the slots shown in the embodiment of FIG. 1.

Since liquid is removed by vacuum suction, rather than evaporation, in methods and processes according to the present invention, no residue remains on the substrate surfaces and, thereby, no "water marks" are produced. In other words, as a liquid droplet is removed via vacuum suction, dissolved solid material within the liquid droplet is also removed, leaving substantially no solid residue behind. Since no solvents (e.g., alcohol) are used during removal of liquid, the processes according to the present invention are environmentally sound. In addition, since the processes do not require introduction of nitrogen, they are cost effective.

In addition to the processes described above, FIGS. 1-3 also serve to illustrate apparatus according to the present invention. Referring to FIGS. 1-3, an apparatus for removing liquid from surfaces of a substrate includes a plurality of vacuum application members configured for applying vacuum suction to surfaces of a substrate, and thereby removing liquid therefrom. In one exemplary embodiment 10 illustrated in FIG. 1, the vacuum application members include two vacuum application members (see element 100 of FIG. 1), each with a slot 102 configured for disposition in close proximity (e.g., within 1/32 of an inch) to the substrate surfaces and for application of vacuum suction to a substrate 104 passing through a gap 103 therebetween.

In other exemplary embodiments 20 and 30 (illustrated in FIGS. 2-3), the vacuum application members include at least two partially porous tubes (e.g., tubes 200 or stationary tubes 300) configured for moving contact with the substrate surfaces. In these embodiments, vacuum suction is provided in the central open region of the tubes and applied to the substrate surfaces via the tube's pores. In addition, in the circumstance that the tubes are formed of an absorbent material, the absorbent material can serve to wick liquid from the surfaces of the substrate. Suitable absorbent materials include, for example, polyvinyl acetate, perfluoroactetate, polyproplylene, and polyethylene. The liquid that has been wicked from the surface is removed from the absorbent material using the vacuum suction.

Though not illustrated in these figures, one skilled in the art will recognize that apparatus according to the present invention can be enclosed within a suitable chamber or configured such that the substrates are exposed to a clean room environment.

Figure 4:
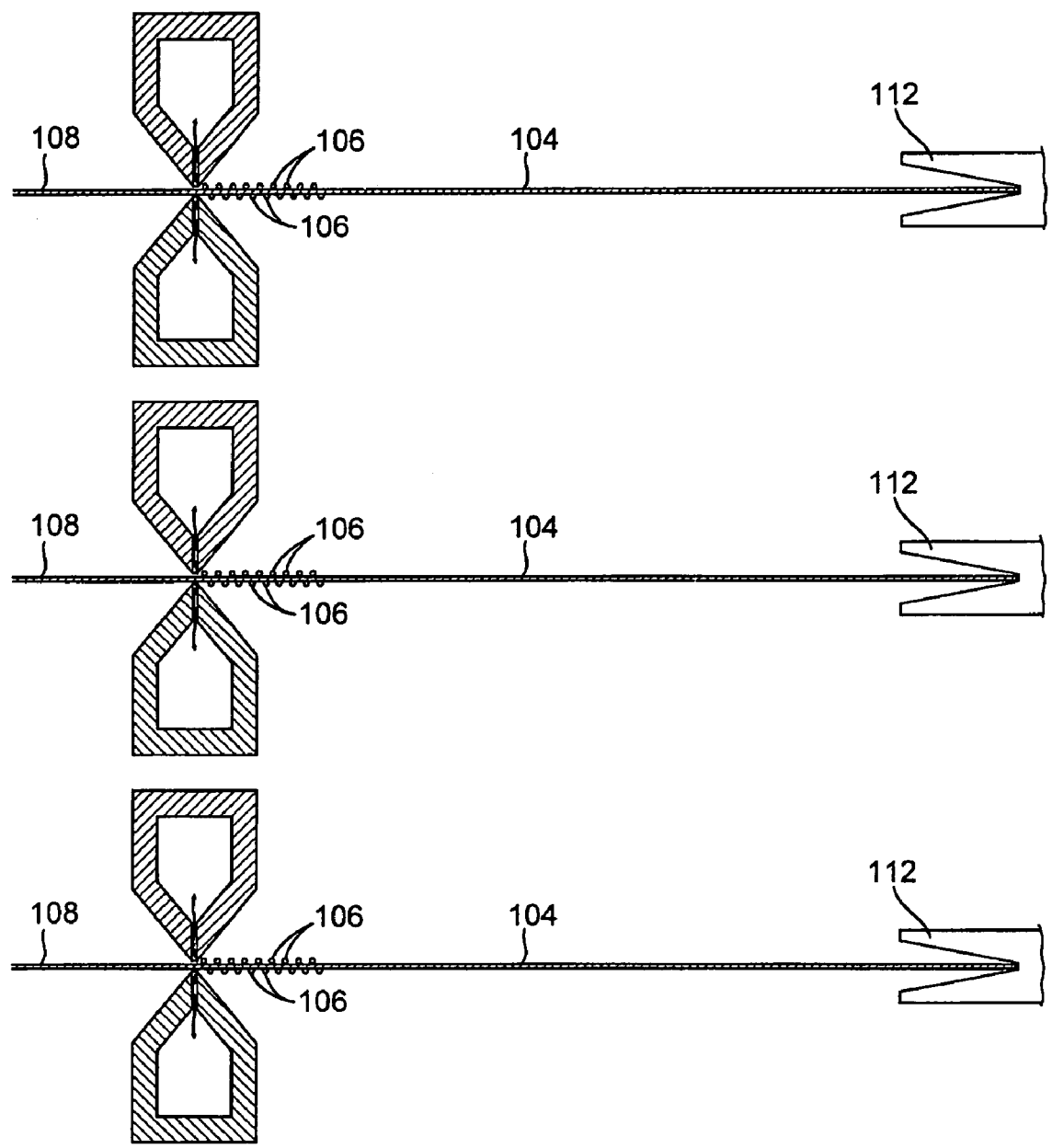
FIG. 4 is a schematic diagram of an apparatus for removing liquid from surfaces of multiple substrates simultaneously according to yet another exemplary embodiment of the present invention.

Although for ease of illustration and exemplary purposes only, process and apparatus embodiments have been so far described using the concept of removing liquid from one substrate at a time, processes and apparatus can be readily modified to remove liquid from surfaces of multiple substrates simultaneously while still falling within the scope of the present invention. For example, multiple vacuum application members can be configured such that each substrate within a batch of substrates (e.g., 25 semiconductor wafers) can be simultaneously transported between two of the vacuum application members, as shown in FIG. 4. Alternatively, multiple "fingers" each equipped with a vacuum application member (either a slotted vacuum application member or an at least partially porous tube vacuum application member), can be employed to remove liquid from surfaces across each of the multiple substrates simultaneously.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method of removing liquid from a substrate, the method comprising:

providing a substrate selected from the group consisting of a semiconductor wafer, a disc medium, and a glass flat panel, with an upper surface and a lower surface; and applying vacuum to the upper and lower surfaces through first and second porous vacuum application members in moving contact with the upper and lower substrate surfaces, respectively, thereby removing liquid thereon in the liquid state via suction;

wherein the vacuum application members are stationary in the moving contact with the surfaces of the substrates, and wherein the first and second vacuum application members are in a shape of a tube having pores and a central open region, and the suction is provided in the central open region and applied to the substrate surfaces via the pores.

2. The method of claim 1 wherein the vacuum application members comprise an absorbent material, the method further comprising the absorbent material wicking the liquid from the surfaces of the substrates.

3. An apparatus for removing liquid from surfaces of a substrate comprising:
a plurality of vacuum application members configured for applying vacuum suction to surfaces of the substrate, and thereby removing liquid in the liquid state therefrom, the vacuum application members comprising at least partially porous tubes configured for moving contact with the substrate surfaces;
wherein the vacuum application members are configured to remain stationary in the moving contact with the surfaces of the substrates, and
wherein the vacuum application members define a central open region, vacuum suction provided in the central open region applied to the substrate surfaces via pores in the tubes.

4. The apparatus of claim 3, wherein the at least partially porous tubes are formed of an absorbent material.

5. The apparatus of claim 3, wherein the vacuum application members are configured to remove liquid from the surfaces of a single substrate.

6. The apparatus of claim 3, wherein the vacuum application members are configured to remove liquid from the surfaces of multiples substrates.

7. The apparatus of claim 3, wherein the vacuum application members are configured to apply equal vacuum suction to an upper surface and a lower surface of the substrate simultaneously.

8. An apparatus for removing liquid from surfaces of a substrate comprising:
a plurality of vacuum application members configured for applying vacuum suction to surfaces of the substrate, and thereby removing liquid in the liquid state therefrom, the vacuum application members comprising at least partially porous tubes configured for moving contact with the substrate surfaces;
wherein the vacuum application members are configured to remain stationary in the moving contact with the surfaces of the substrates, and
wherein an entire periphery of the vacuum application members are porous.

9. The apparatus of claim 8, wherein the at least partially porous tubes are formed of an absorbent material.

10. The apparatus of claim 8, wherein the vacuum application members are configured to remove liquid from the surfaces of a single substrate.

11. The apparatus of claim 8, wherein the vacuum application members are configured to remove liquid from the surfaces of multiples substrates.

12. The apparatus of claim 8, wherein the vacuum application members are configured to apply equal vacuum suction to an upper surface and a lower surface of the substrate simultaneously.

13. An apparatus for removing liquid from surfaces of a substrate comprising:
a plurality of vacuum application members configured for applying vacuum suction to surfaces of the substrate, and thereby removing liquid in the liquid state therefrom, the vacuum application members comprising at least partially porous tubes configured for moving contact with the substrate surfaces;
wherein the vacuum application members are configured to remain stationary in the moving contact with the surfaces of the substrates, and
wherein only a portion of the periphery of the vacuum application members in contact with the substrate surfaces are porous.

14. The apparatus of claim 13, wherein the at least partially porous tubes are formed of an absorbent material.

15. The apparatus of claim 13, wherein the vacuum application members are configured to remove liquid from the surfaces of a single substrate.

16. The apparatus of claim 13, wherein the vacuum application members are configured to remove liquid from the surfaces of multiples substrates.

17. The apparatus of claim 13, wherein the vacuum application members are configured to apply equal vacuum suction to an upper surface and a lower surface of the substrate simultaneously.

* * * * *